(12) United States Patent
Deshmane et al.

(10) Patent No.: US 11,808,813 B2
(45) Date of Patent: Nov. 7, 2023

(54) APPARATUS AND METHOD FOR CONTROLLING UNIT SPECIFIC JUNCTION TEMPERATURE WITH HIGH TEMPORAL RESOLUTION FOR CONCURRENT CENTRAL PROCESSING UNIT (CPU) CORE TESTING

(71) Applicant: Intel Corporation, Santa Clara, CA (US)

(72) Inventors: Mahesh Deshmane, Chandler, AZ (US); Shoujie He, Plano, TX (US); Christopher Wade Ackerman, Phoenix, AZ (US); Jacob Hales, Eagle Mountain, UT (US); Johnny Mata Vega, Alajuela (CR); Joseph Zearing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/692,248

(22) Filed: Mar. 11, 2022

(65) Prior Publication Data

US 2023/0288480 A1 Sep. 14, 2023

(51) Int. Cl.
*G01R 31/319* (2006.01)
*G01R 31/28* (2006.01)
*G01R 31/317* (2006.01)

(52) U.S. Cl.
CPC ... *G01R 31/31905* (2013.01); *G01R 31/2874* (2013.01); *G01R 31/31721* (2013.01); *G01R 31/31917* (2013.01)

(58) Field of Classification Search
CPC .............. G01R 1/0458; G01R 31/2874; G01R 31/2877; G01R 31/2875; G01R 31/2844; G01R 31/31713; G01R 31/31905; G01R 31/2817; G01R 31/2881; G01R 31/26; G01R 31/2891; G01R 31/2889; G01R 31/31721; G01R 31/319; F28F 27/00
See application file for complete search history.

(56) References Cited

U.S. PATENT DOCUMENTS

| | | | | |
|---|---|---|---|---|
| 8,025,097 | B2* | 9/2011 | Di Stefano | G05D 23/1393 361/677 |
| 8,151,872 | B2* | 4/2012 | Di Stefano | G05D 23/1931 165/80.4 |
| 9,291,667 | B2* | 3/2016 | Armstrong | G05D 23/1919 |
| 9,353,959 | B2* | 5/2016 | Jan | F24F 3/1423 |
| 9,419,590 | B2* | 8/2016 | Berzins | H03K 3/0372 |
| 9,759,769 | B2* | 9/2017 | Yoo | G01R 31/31721 |
| 9,810,729 | B2* | 11/2017 | Frediani | G01R 31/31907 |

* cited by examiner

*Primary Examiner* — Vinh P Nguyen
(74) *Attorney, Agent, or Firm* — VIERING, JENTSCHURA & PARTNER MBB

(57) ABSTRACT

An apparatus includes a processor configured to control an automatic test equipment (ATE) to measure one or more parameters of a current test instance for testing a device under test (DUT), during execution of the current test instance on the DUT, and determine, based on the measured one or more parameters, one or more controls for controlling a temperature of a thermal head connected to the DUT so that a junction temperature of the DUT corresponds to a predetermined test temperature. The processor is further configured to control the temperature of the thermal head, based on the determined one or more controls.

20 Claims, 8 Drawing Sheets

APPARATUS AND METHOD FOR CONTROLLING UNIT SPECIFIC JUNCTION TEMPERATURE WITH HIGH TEMPORAL RESOLUTION FOR CONCURRENT CENTRAL PROCESSING UNIT (CPU) CORE TESTING

BACKGROUND

A typical sort or class test program for a client and server central processing unit (CPU) may include hundreds of test instances. Each instance can target an intellectual property (IP) block within a CPU die to determine a minimum operating voltage $V_{min}$ required for a maximum operating frequency $F_{max}$ of operation. Given multiple $F_{max}$ and $V_{min}$ bins that result due to semiconductor process variations, the test program may include complicated branching structures that are used for die recovery if a device under test (DUT) fails a specific $F_{max}$ and $V_{min}$ combination for a particular IP block. Test instance durations may vary between a few 100 milliseconds to 10 seconds depending on an amount and a type of test content. Every test instance can be divided into three discrete-time phases: a preamble, a pattern execution and a postamble.

A significant amount of power proportional to a frequency and a voltage may be drawn from a power supply of an automatic test equipment (ATE) during a pattern execution phase. A density and a rate of change (derivative) of this power draw can be very high, depending on a structural layout of an IP block and a type of test content that result in local hot spots where the test content is executed. Low-frequency thermal control loops that are responsible for maintaining a stable junction temperature $T_j$ during a test program may not keep up, which can result in massive hot spots on silicon. These hot spots may reduce an $F_{max}$ and $V_{min}$ ratio and hurt a performance and watt metric for a product being tested. All the above can be attributed to a lack of an accurate junction temperature $T_j$ control mechanism with a high temporal resolution during the pattern execution phase of a test instance that may only affect the test instance of interest without victimizing neighboring test instances to ensure zero compromise on test quality.

Junction temperature $T_j$ control during test may largely rely on a low frequency thermal control loop. A setpoint of the thermal control loop can be altered before a certain area of test, to reduce a phase lag associated with a low frequency response of the thermal control loop. However, this altering may not address junction temperature $T_j$ control accuracy issues related to power density and per DUT power variability. Also, the altering cannot be scaled given a continuous change in test program content during an engineering phase of product development.

BRIEF DESCRIPTION OF THE DRAWINGS

In the drawings, like reference characters generally refer to the same parts throughout the different views. The drawings are not necessarily to scale, emphasis instead generally being placed upon illustrating the present disclosure. The dimensions of the various features or elements may be arbitrarily principles expanded or reduced for clarity. In the following description, various aspects of the present disclosure are described with reference to the following drawings, in which.

DETAILED DESCRIPTION

Figure 1:
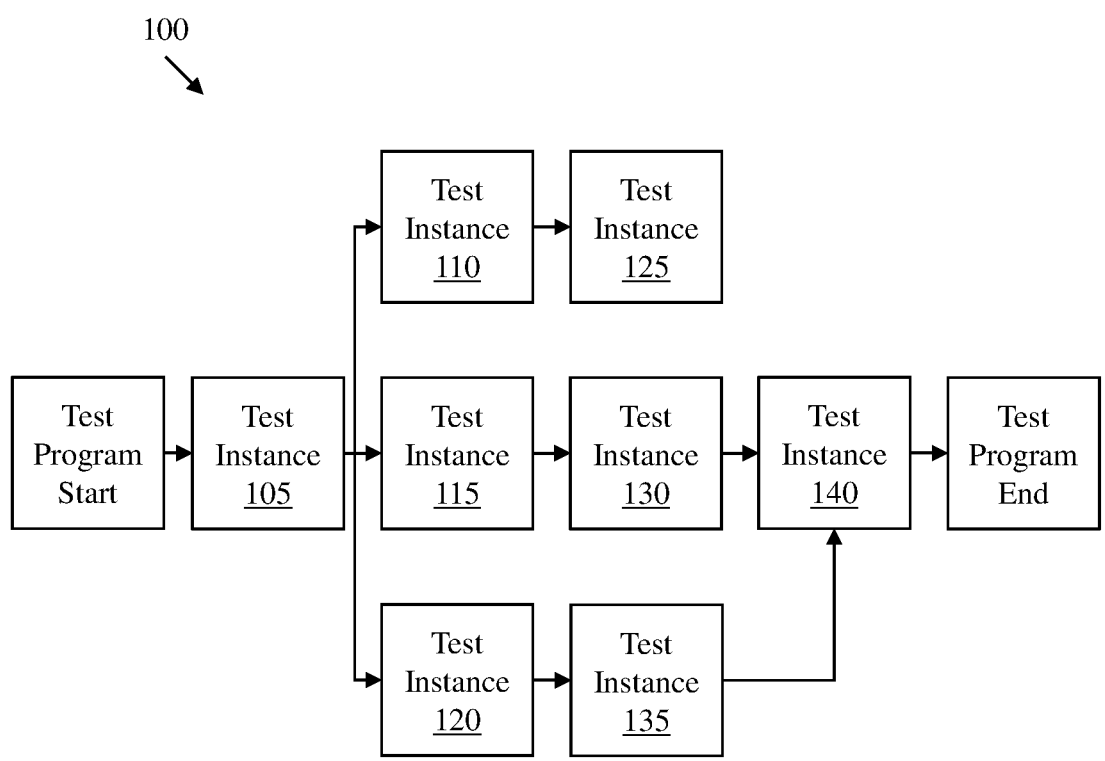
FIG. 1 is a block diagram of a test program.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure relates to an apparatus and a method for controlling unit specific junction temperature $T_j$ for concurrent CPU core testing.

A present apparatus may include a processor configured to control an automatic test equipment (ATE) to measure one or more parameters of a current test instance for testing a device under test (DUT), during execution of the current test instance on the DUT, and determine, based on the measured one or more parameters, one or more controls for controlling a temperature of a thermal head connected to the DUT so that a junction temperature of the DUT corresponds to a predetermined test temperature. The processor is further configured to control the temperature of the thermal head, based on the determined one or more controls.

In another aspect, a method pursuant to the present disclosure may include controlling an automatic test equipment (ATE) to measure one or more parameters of a current test instance for testing a device under test (DUT), during execution of the current test instance on the DUT, and determining, based on the measured one or more parameters, one or more controls for controlling a temperature of a thermal head connected to the DUT so that a junction temperature of the DUT corresponds to a predetermined test temperature. The method may further include controlling the temperature of the thermal head, based on the determined one or more controls.

In yet another aspect, a non-transitory computer-readable medium may include instructions, which, if executed by a processor, cause the processor to control an automatic test equipment (ATE) to measure one or more parameters of a current test instance for testing a device under test (DUT), during execution of the current test instance on the DUT, and determine, based on the measured one or more parameters, one or more controls for controlling a temperature of a thermal head connected to the DUT so that a junction temperature of the DUT corresponds to a predetermined test temperature. The instructions, which, if executed by the processor, further cause the processor to control the temperature of the thermal head, based on the determined one or more controls.

In detail, the present apparatus may perform offline, unit specific junction temperature $T_j$ control training using power traces, digital temperature sensors and DUT specific parametric measurements as feedback variables, to compute a pre-emphasis control (compensating a time lag for a high-power derivative) and a gain control (addressing a power density) of a low frequency thermal control loop. These pre-emphasis and gain controls can be proactively and precisely applied during runtime at a beginning of a pattern execution phase of a high-power test instance, and can be tailored per DUT.

The above-detailed aspects may accurately maintain a junction temperature $T_j$ during the pattern execution phase of a high-power (derivate and density) test instance to improve high performance bin splits (high $F_{max}$ and $V_{min}$ ratios) as well as ensure an absence of undertest leading to quality issues after a product is deployed. Further, the aspects can significantly reduce test time for the high-power (derivative and density) test instance by enabling concurrent CPU core testing that was often thermally limited in the past.

FIG. 1 is a block diagram of a test program 100.

Referring to FIG. 1, the test program 100 may include test instances 105, 110, 115, 120, 125, 130, 135 and 140.

The test instance 105 may be referred to as a flow control test instance. A flow of the test program 100 can branch off to the test instance 110, 115 or 120 after completion of the test instance 105. The test instances 110, 115 and 120 may have very different power and thermal characteristics, and hence junction temperature $T_j$ controls may be specifically tailored per test instance instead of for a group of test instances per DUT.

Figure 2:
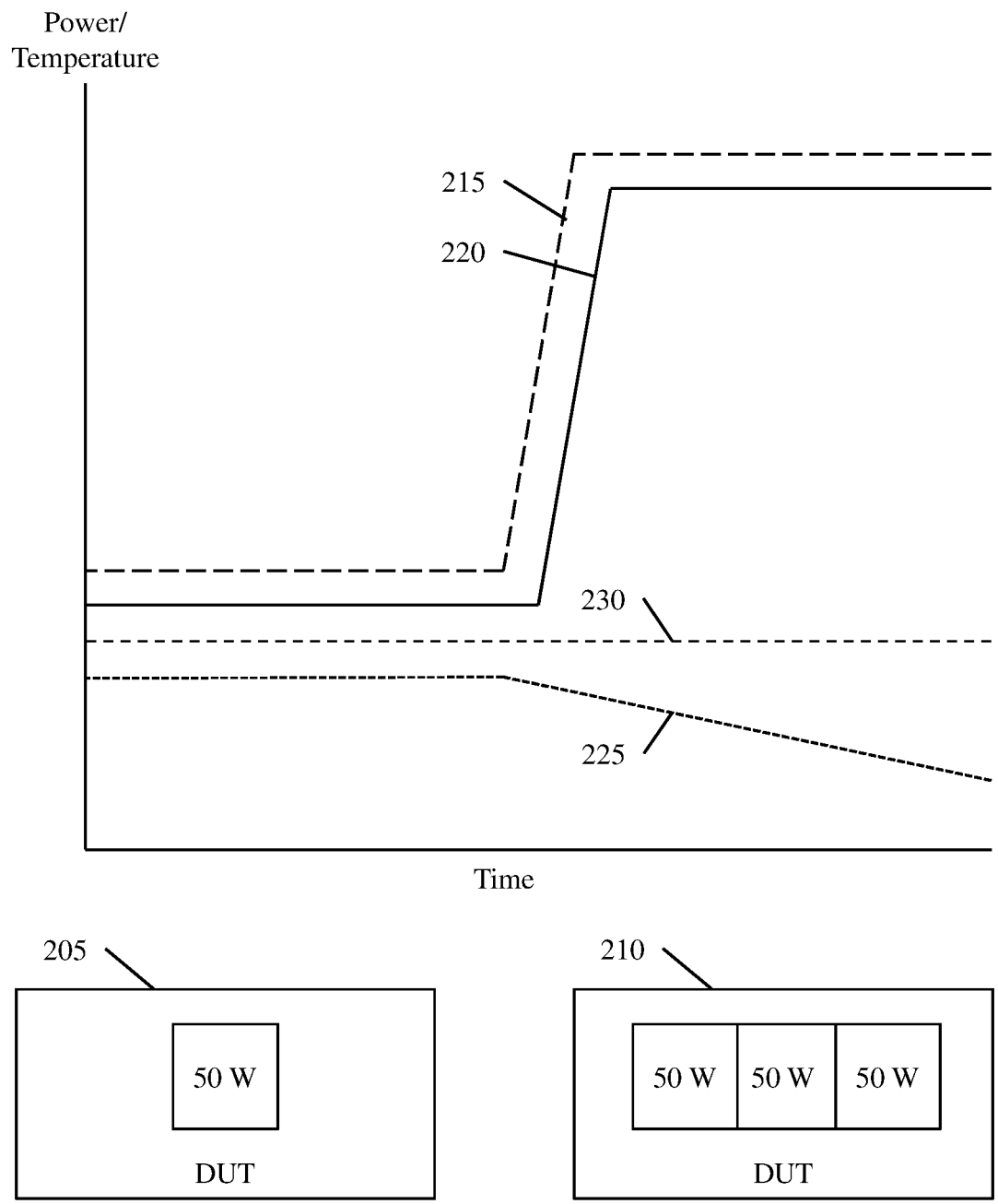
FIG. 2 is a diagram of a high-power derivative case of executing two test instances included in a test program.
Figure 3:
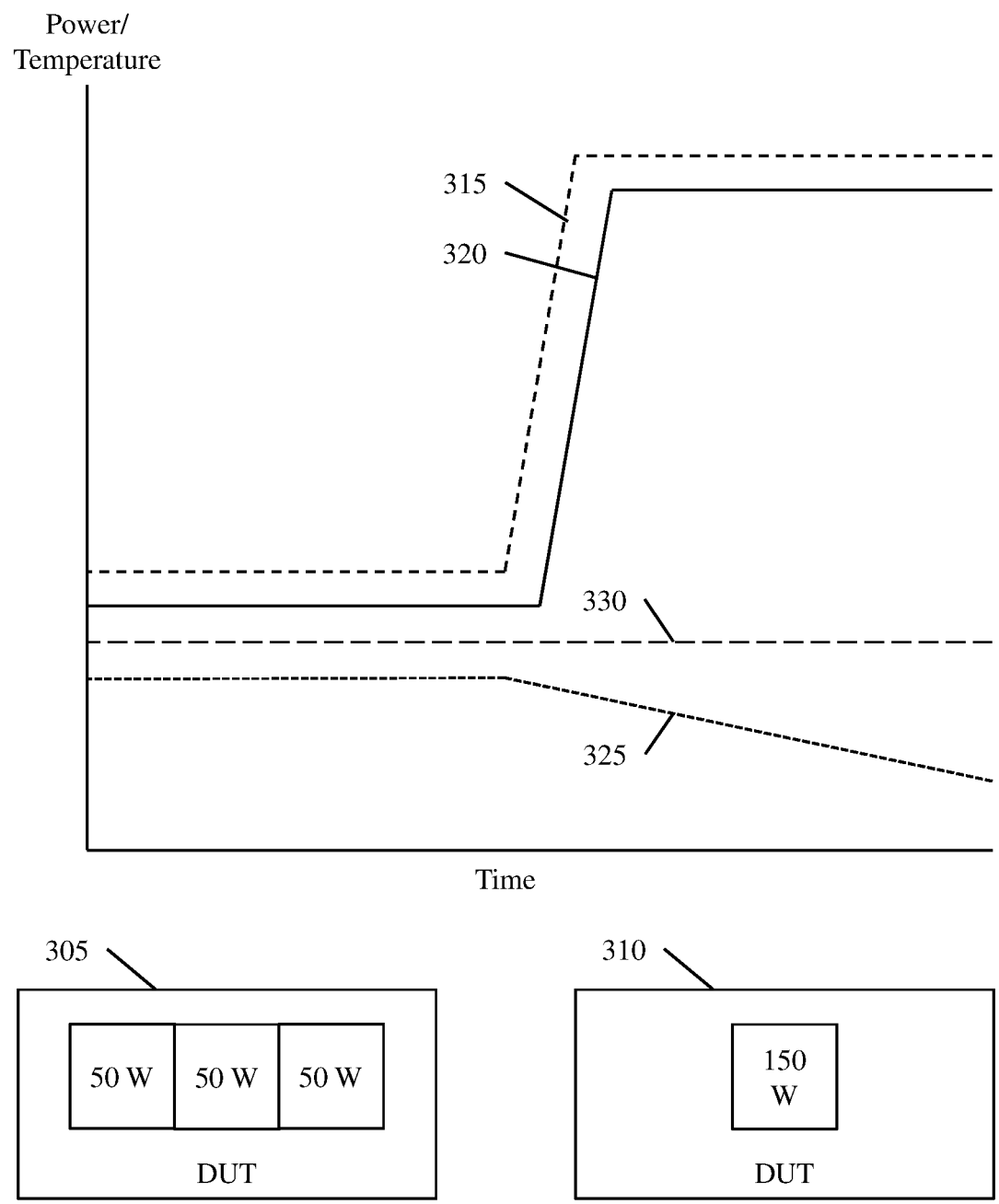
FIG. 3 is a diagram of a high-power density case of executing two test instances included in a test program.

FIG. 2 is a diagram of a high-power derivative case of executing two test instances 205 and 210 included in a test program. FIG. 3 is a diagram of a high-power density case of executing two test instances 305 and 310 included in a test program.

Referring to FIGS. 2 and 3, both the high-power derivative case and the high-power density case result in hot spots on a DUT on which respective test instances are executed.

As shown in FIG. 2, the high-power derivative case shows up when a power draw 215 of a DUT significantly increases (e.g., changes at a rate greater than a predetermined rate) between the two test instances 205 and 210. In detail, the test instance 205 includes the DUT drawing 50 watts (W) of power at 1 test area, which is followed by the test instance 210 including the DUT drawing 50 W of power at 3 test areas. This results in the significant increase of the power draw 215 and a significant increase of a junction temperature $T_j$ 220 of the DUT, which results in a decrease in a temperature 225 of a thermal control system or a low frequency response of the thermal control system. A power density 230 of the DUT (power draw per test area) remains constant.

As shown in FIG. 3, the high-power density case shows up when a power density 315 of a DUT significantly increases (e.g., changes at a rate greater than a predetermined rate) between the two test instances 305 and 310. In detail, the test instance 305 includes the DUT drawing 50 W of power at 3 test areas, which is followed by the test instance 310 including the DUT drawing 150 W of power at 1 test area. This results in the significant increase of the power density 315 and a significant increase of a junction temperature $T_j$ 320 of the DUT, which results in a decrease in a temperature 325 of the thermal control system or a low frequency response of the thermal control system. A power draw 330 of the DUT remains constant.

Figure 4:
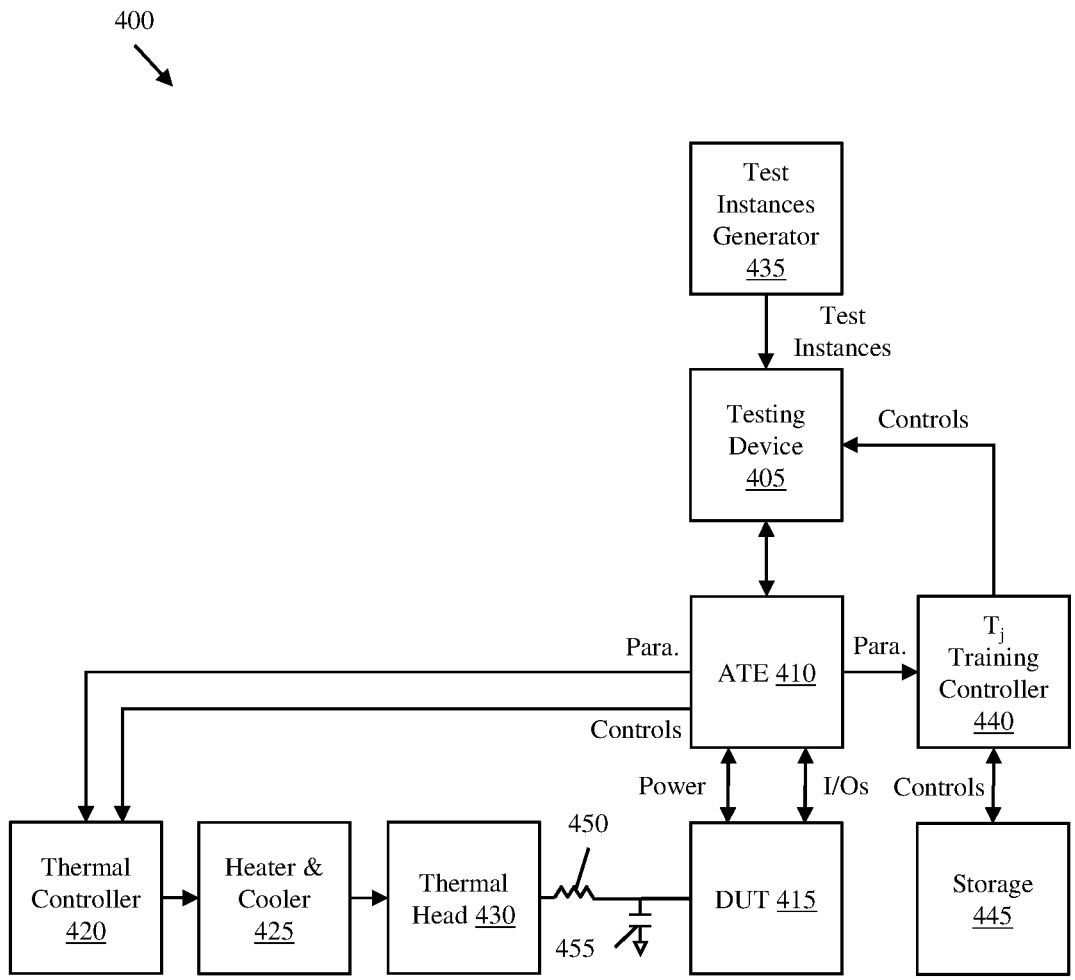
FIG. 4 is a block diagram of an apparatus for controlling unit specific junction temperature $T_j$ for concurrent CPU core testing, according to aspects of the present disclosure.

FIG. 4 is a block diagram of an apparatus 400 for controlling unit specific junction temperature $T_j$ for concurrent CPU core testing, according to aspects of the present disclosure.

Referring to FIG. 4, the apparatus 400 includes a testing device 405, an ATE 410, a DUT 415, a thermal controller 420, a heater and cooler 425 and a thermal head 430. The apparatus 400 further includes a test instances generator 435, a junction temperature $T_j$ training controller 440 and a storage 445. The testing device 405 executes a test program for testing the DUT 415.

The test instances generator 435 generates a list of all high-power derivative and density test instances that may need accurate control of a junction temperature $T_j$ of the DUT 415, and may generate allowed temperature tolerance values for these test instances. The allowed temperature tolerance values can include a predetermined range of temperatures (e.g., +5 degrees to −5 degrees Celsius) in which the junction temperature $T_j$ can deviate from a predetermined test temperature during execution of a test instance. The test instances generator 435 sends the list and the allowed temperature tolerance values to the testing device 405, which inserts the list and the allowed temperature tolerance values into the test program.

The testing device 405 executing the test program controls the ATE 410 to measure parameters ("para.") of a current test instance included in the test program, during execution of the current test instance on the DUT 415. The parameters may correspond to characteristics of the DUT 415 that may include a power draw ("power"), the junction temperature $T_j$ and/or leakage and/or ring oscillator frequencies ("inputs/outputs (I/Os)"). The parameters can be measured during execution of only each of the high-power derivative and density test instances included in the inserted list of such test instances. The testing device 405 sends the measured parameters to the junction temperature $T_j$ training controller 440. The testing device 405 may further send the measured parameters to the thermal controller 420.

The junction temperature $T_j$ training controller 440 receives, from the ATE 410, the measured parameters of the current test instance executed on the DUT 415. The junction temperature $T_j$ training controller 440 determines, based on the received parameters, one or more controls (e.g., pre-emphasis and gain controls, corrective actions or control signals) for controlling a thermal control loop (e.g., the thermal controller 420, the heater and cooler 425 and the thermal head 430), before a next test instance included in the test program is executed on the DUT 415 or while the current test instance is executed on the DUT 415.

For example, the pre-emphasis controls may include the testing device 405 pausing a flow of the test program (e.g., before the next test instance is executed), controlling the ATE 410 to drive the thermal controller 420 and the heater and cooler 425 to pre-condition a temperature of the thermal head 430 to a predetermined pre-emphasis temperature, and un-pausing the test program when release criteria are met. The release criteria can include a predetermined range of temperatures (e.g., +5 degrees to −5 degrees Celsius) in which the temperature of the thermal head 430 can deviate from the predetermined pre-emphasis temperature. In this example, if the current test instance executed on the DUT 415 is a high-power derivative test instance and results in a measurement of a high junction temperature $T_j$, then the pre-emphasis controls may include controlling the ATE 410 to drive the thermal controller 420 and the heater and cooler 425 to decrease the temperature of the thermal head 430 to the predetermined temperature, so that the next test instance may result in a measurement of a lower junction temperature $T_j$ closer to the predetermined test temperature, e.g., within the allowed temperature tolerance values of the predetermined test temperature.

In another example, the gain controls may include the testing device 405, while the current test instance is being executed on the DUT 415, controlling the ATE 410 to drive the thermal controller 420 and the heater and cooler 425 to increase or decrease the temperature of the thermal head 430 by a predetermined gain temperature (e.g., 5 degrees Celsius) so that the current test instance may result in a measurement of the junction temperature $T_j$ closer to the predetermined test temperature, e.g., within the allowed temperature tolerance values of the predetermined test temperature.

The junction temperature $T_j$ training controller 440 may send the determined controls to the testing device 405 in a look-up table to be used for all remaining DUTs in a lot. The controls in the look-up table can also be persistently stored in the storage 445, for use with future DUTs and lots of the same product to avoid regression of junction temperature $T_j$ control. In the look-up table, the controls may be in the form of equations in which the parameters to be measured from the DUTs are variables, and the controls may be indexed to correspond to specific values of the measured parameters.

The apparatus 400 further includes a resistor 450 interposed between the thermal head 430 and the DUT 415, and a capacitor 455 interposed between the resistor 450 and the DUT 415. The resistor 450 may have a high thermal interface resistance that attenuates a cooling response for a high-power density case. The capacitor 455 may have a high thermal capacitance that delays a cooling response for a high-power derivative case.

For future DUTs, the testing device 405 executing the test program may control the ATE 410 to measure parameters of each high-power test instance included in a test program for testing a DUT, may determine the controls, using the measured parameters as indices in the fully-trained look-up table, and may transmit the determined controls to the ATE 410, prior to or during execution of each high-power test instance. The ATE 410 transmits these controls to the thermal controller 420 before or during execution of every high-power test instance, at a high temporal resolution of 4 milliseconds, to proactively correct for a slow thermal control response.

The above-described loop may continue to operate until junction temperature $T_j$ tolerance is achieved (e.g., the junction temperature $T_j$ is within the allowed temperature tolerance values of the predetermined test temperature) across a large volume of samples of parameters measured from one or more DUTs. Training of the look-up table of the controls for the thermal controller 420, the heater and cooler 425 and the thermal head 430 can then be concluded. However, application of the look-up table of the controls may continue across all future DUTs in current and future lots to avoid any regression in the junction temperature $T_j$ control.

Figure 5:
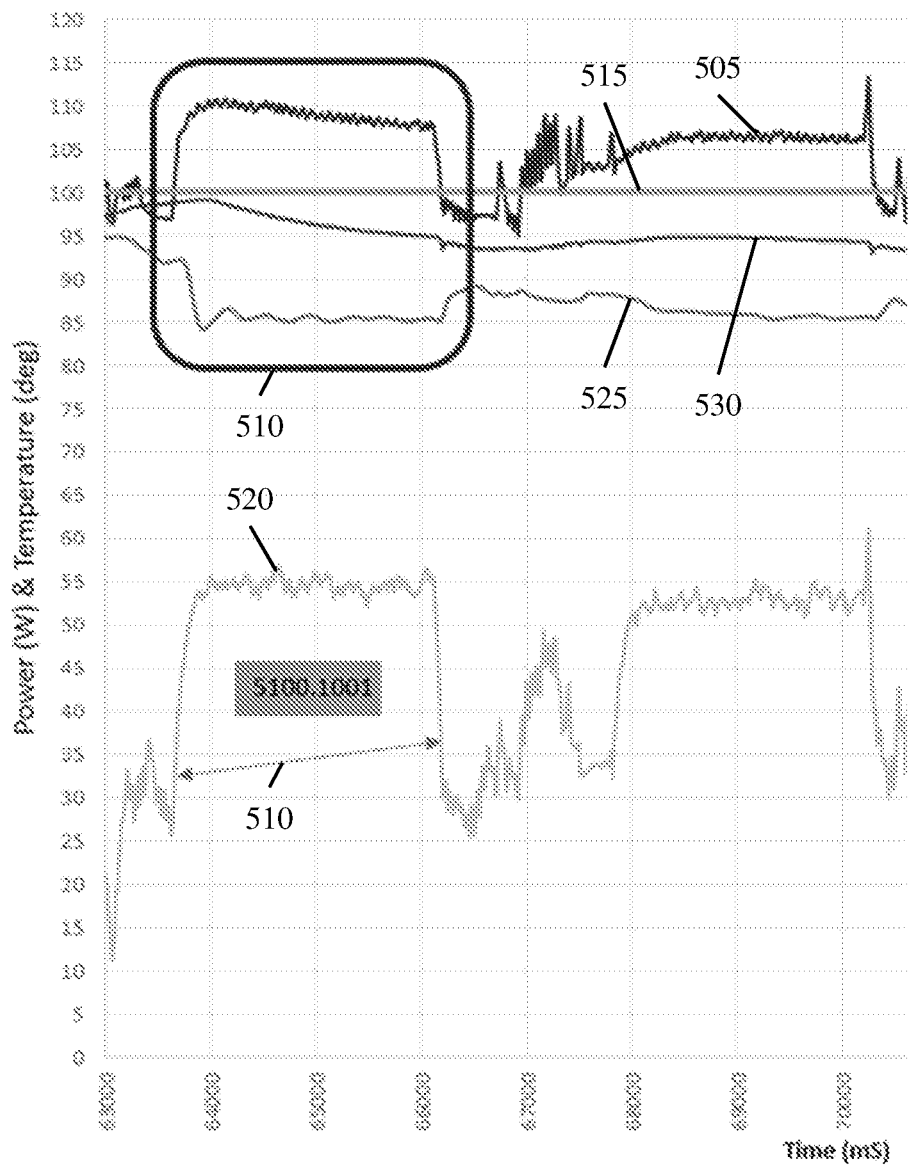
FIG. 5 is a graph of a junction temperature $T_j$ without per unit junction temperature TT control, according to aspects of the present disclosure.
Figure 6:
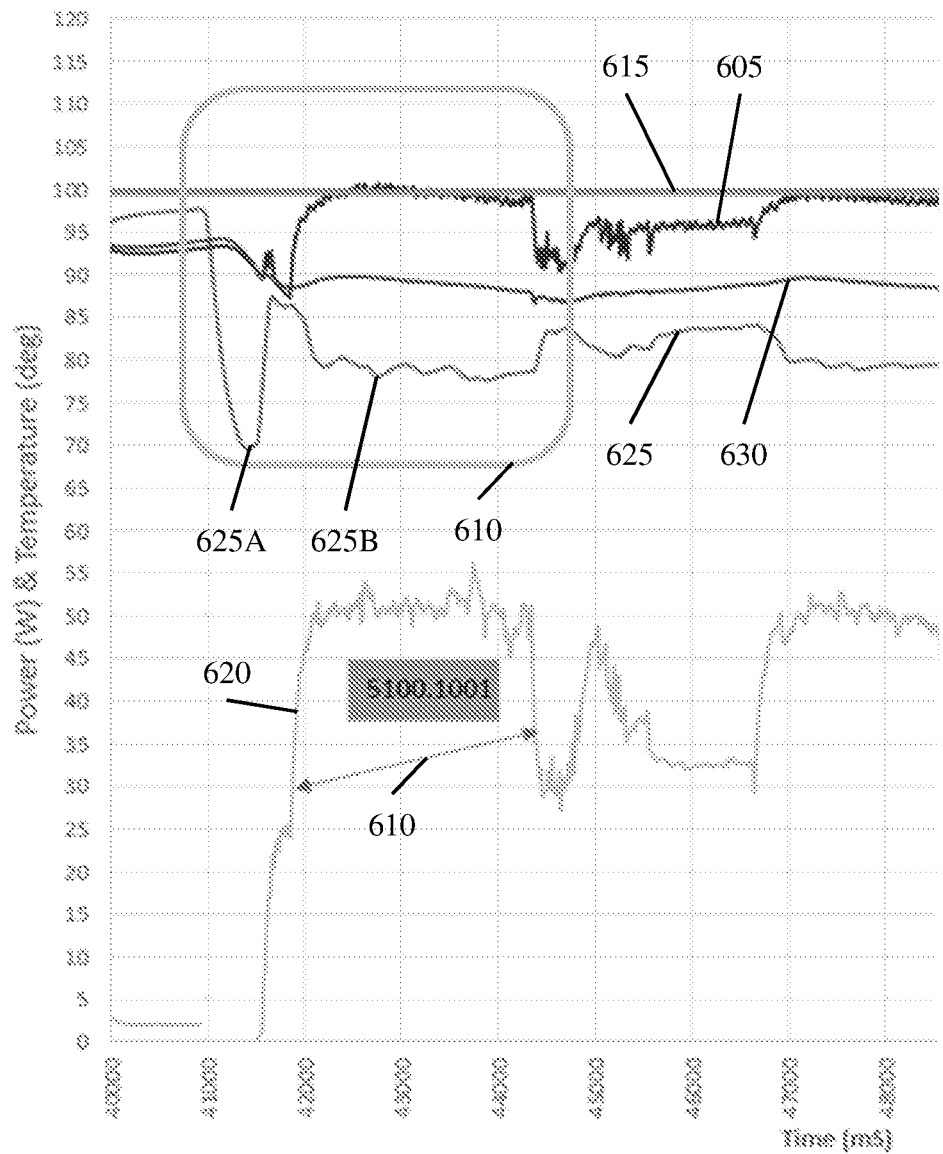
FIG. 6 is a graph of a junction temperature $T_j$ with per unit junction temperature $T_j$ control, according to aspects of the present disclosure.

FIG. 5 is a graph of a junction temperature $T_j$ 505 without per unit junction temperature $T_j$ control, according to aspects of the present disclosure. FIG. 6 is a graph of a junction temperature $T_j$ 605 with per unit junction temperature $T_j$ control, according to aspects of the present disclosure.

Referring to FIGS. 5 and 6, the graphs show a difference between the junction temperature $T_j$ 505 due to a high-power test instance 510 ("5100.1001") executed on a DUT without the junction temperature $T_j$ control and the junction temperature $T_j$ 605 due to a high-power test instance 610 ("5100.1001") executed on a DUT with the junction temperature $T_j$ control. A predetermined test temperature 515 or 615 may be 100 degrees Celsius.

As shown in FIG. 5, when an instantaneous power draw 520 of the high-power test instance 510 has a high rate of change, a thermal controller temperature 525 and a thermal head temperature 530 may remain under the predetermined test temperature 515. However, the junction temperature $T_j$ 505 can increase above the predetermined test temperature 515 without the junction temperature $T_j$ control.

As shown in FIG. 6, after the junction temperature $T_j$ control is determined and performed using many samples of parameters measured from a prior high-power test instance and/or the current high-power test instance 610, even when an instantaneous power draw 620 of the current high-power test instance 610 has a high rate of change, the apparatus 400 of FIG. 4 may allow for precise control of the junction temperature $T_j$ 605, a thermal controller temperature 625 and a thermal head temperature 630 to be under the predetermined test temperature 605. The junction temperature $T_j$ control includes a pre-emphasis control 625A of decreasing the thermal controller temperature 625 and the thermal head temperature 630 before execution of the current high-power test instance 610. The junction temperature $T_j$ control further includes a gain control 625B of decreasing or maintaining the thermal controller temperature 625 and the thermal head temperature 630 during execution of the current high-power test instance 610.

Figure 7:
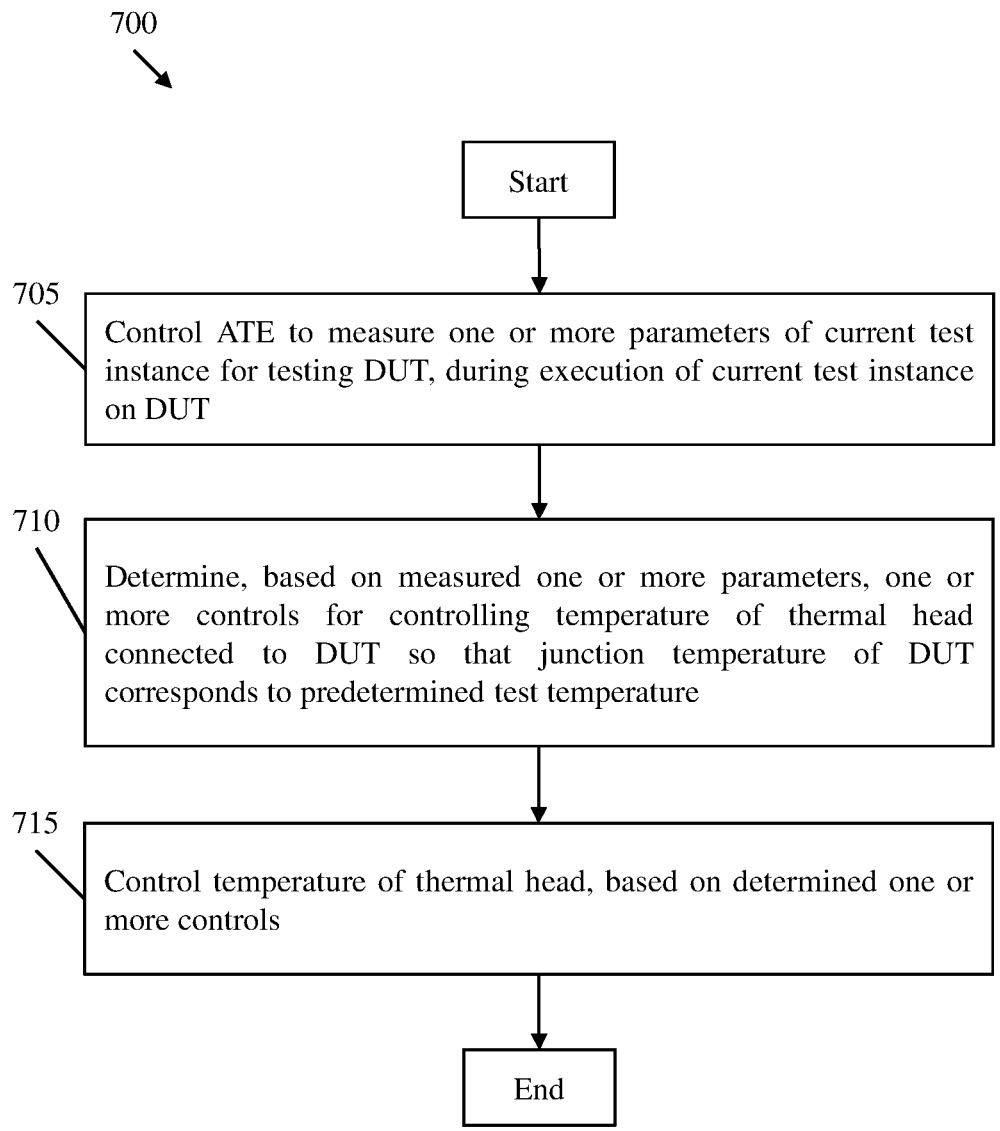
FIG. 7 is a flow diagram of a method of controlling unit specific junction temperature $T_j$ for concurrent CPU core testing, according to aspects of the present disclosure.

FIG. 7 is a flow diagram of a method 700 of controlling unit specific junction temperature $T_j$ for concurrent CPU core testing, according to aspects of the present disclosure.

Operation 705 may be directed to controlling an automatic test equipment (ATE) to measure one or more parameters of a current test instance for testing a device under test (DUT), during execution of the current test instance on the DUT.

Operation 710 may be directed to determining, based on the measured one or more parameters, one or more controls for controlling a temperature of a thermal head connected to the DUT so that a junction temperature of the DUT corresponds to a predetermined test temperature.

Operation 715 may be directed to controlling the temperature of the thermal head, based on the determined one or more controls.

The method 700 may further include generating a list of test instances for testing the DUT, each of the test instances causing a power draw of the DUT or a power density of the DUT to change at a rate greater than a predetermined rate.

The method 700 may further include generating a predetermined range of temperatures in which the junction temperature of the DUT can deviate from the predetermined test temperature during execution of each of the test instances on the DUT.

The controlling the ATE may include controlling the ATE to measure one or more parameters of only each of the test instances included in the generated list, during execution of a respective one of the test instances on the DUT.

The controlling the temperature of the thermal head may include, based on the one or more controls including pre-emphasis controls, before execution of a next test instance for testing the DUT, control the temperature of the thermal head to correspond to a predetermined pre-emphasis temperature.

The controlling the temperature of the thermal head may include, based on the one or more controls including gain controls, while the current test instance is executed, control the temperature of the thermal head to increase or decrease by a predetermined gain temperature.

The methods and sequence of steps presented above are intended to be examples for controlling unit specific junction temperature $T_j$ for concurrent CPU core testing, according to the present disclosure. It will be apparent to those ordinary skilled practitioners that the foregoing process operations may be modified without departing from the spirit of the present disclosure.

Figure 8:
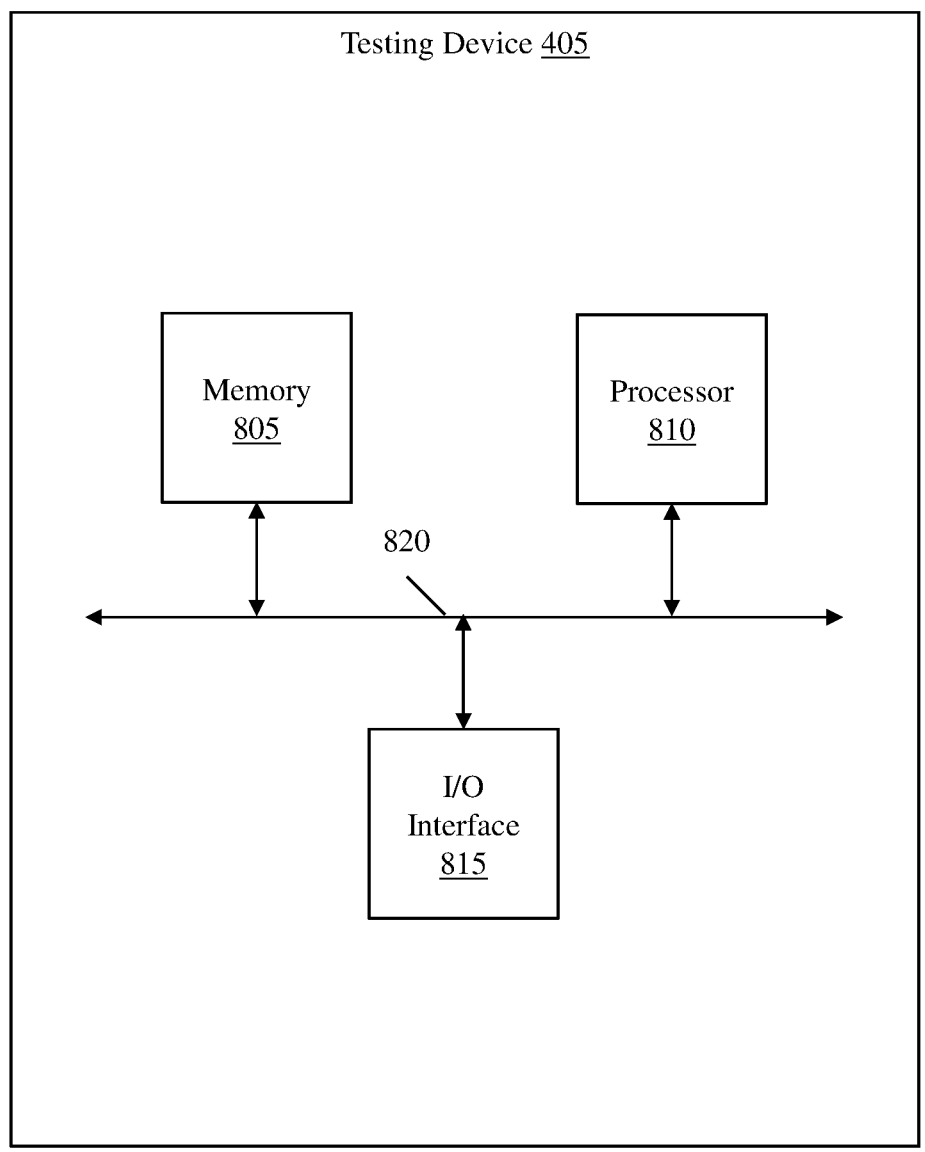
FIG. 8 is a block diagram of a testing device of FIG. 4.

FIG. 8 is a block diagram of the testing device 405 of FIG. 4.

Referring to FIG. 8, the testing device 405 may include a memory 805, a processor 810, an input/output (I/O) interface 815 and a bus 820.

The memory 805 may include a volatile and/or non-volatile memory. The memory 805 can store information, such as one or more of commands, data, programs (one or more instructions), applications, etc., which are related to at least one other component of the testing device 405 and for driving and controlling the testing device 405. For example, commands and/or data may formulate an operating system (OS). Information stored in the memory 805 can be executed by the processor 810. The memory 805 may store the information that is executed by the processor 810 to perform functions and operations described with respect to FIGS. 1-7 above.

The processor 810 may include one or more of a central processing unit (CPU), a graphics processor unit (GPU), an accelerated processing unit (APU), a many integrated core (MIC), a field-programmable gate array (FPGA), and/or a digital signal processor (DSP). The processor 810 can be a general-purpose controller that performs control of any one or any combination of the other components of the testing device 405, and/or performs an operation or data processing relating to communication. The processor 810 may execute one or more programs stored in the memory 805.

The I/O interface 815 may serve as a hardware and/or software interface that can, for example, transfer commands and/or data between a user, other external devices and/or other components of the testing device 405. The I/O interface 815 can further set up communication between the testing device 405 and an external testing device. The I/O interface 815 may be connected to a network through wireless or wired communication architecture to communicate with the external testing device. The I/O interface 815 may be a wired or wireless transceiver or any other component for transmitting and receiving signals.

The bus 820 may include a circuit for connecting the components 805, 810 and 815 with one another. The bus 820 functions as a communication system for transferring data between the components 805, 810 and 815 or between testing devices.

By enabling precise junction temperature $T_j$ control, the above-detailed aspects of the present disclosure may remove all thermal roadblocks associated with concurrent multi-core testing. Further, the aspects can enable use of 2 to 3 times more CPU or graphics processing unit (GPU) cores for concurrent testing as compared to previously. Also, the precise junction temperature $T_j$ control may improve a maximum operation frequency as well as a minimum operating voltage of cores, both of which are desirable attributes for end customers in terms of achieving a higher performance per watt metric.

To more readily understand and put into practical effect the present apparatuses and methods, particular aspects will now be described by way of examples. For the sake of brevity, duplicate descriptions of features and properties may be omitted.

EXAMPLES

Example 1 provides an apparatus including a processor configured to control an automatic test equipment (ATE) to measure one or more parameters of a current test instance for testing a device under test (DUT), during execution of the current test instance on the DUT, and determine, based on the measured one or more parameters, one or more controls for controlling a temperature of a thermal head connected to the DUT so that a junction temperature of the DUT corresponds to a predetermined test temperature. The processor is further configured to control the temperature of the thermal head, based on the determined one or more controls.

Example 2 may include the apparatus of example 1 and/or any other example disclosed herein, for which the one or more parameters may include any one or any combination of a power draw of the DUT, the junction temperature of the DUT and leakage and/or ring oscillator frequencies of the DUT.

Example 3 may include the apparatus of example 1 and/or any other example disclosed herein, for which the processor may be further configured to generate a list of test instances for testing the DUT, each of the test instances causing a power draw of the DUT or a power density of the DUT to change at a rate greater than a predetermined rate.

Example 4 may include the apparatus of example 3 and/or any other example disclosed herein, for which the processor may be further configured to generate a predetermined range of temperatures in which the junction temperature of the DUT can deviate from the predetermined test temperature during execution of each of the test instances on the DUT.

Example 5 may include the apparatus of example 4 and/or any other example disclosed herein, for which the junction temperature of the DUT may correspond to the predetermined test temperature based on a difference between the junction temperature and the predetermined test temperature being within the predetermined range of temperatures.

Example 6 may include the apparatus of example 3 and/or any other example disclosed herein, for which the processor may be further configured to control the ATE to measure one or more parameters of only each of the test instances included in the generated list, during execution of a respective one of the test instances on the DUT.

Example 7 may include the apparatus of example 1 and/or any other example disclosed herein, for which the processor may be further configured to, based on the one or more controls including pre-emphasis controls, before execution of a next test instance for testing the DUT, control the temperature of the thermal head to correspond to a predetermined pre-emphasis temperature.

Example 8 may include the apparatus of example 7 and/or any other example disclosed herein, for which the temperature of the thermal head may correspond to the predetermined pre-emphasis temperature based on a difference between the temperature of the thermal head and the predetermined pre-emphasis temperature being within a predetermined range of temperatures.

Example 9 may include the apparatus of example 1 and/or any other example disclosed herein, for which the processor may be further configured to, based on the one or more controls including gain controls, while the current test instance is executed, control the temperature of the thermal head to increase or decrease by a predetermined gain temperature.

Example 10 may include the apparatus of example 1 and/or any other example disclosed herein, for which the processor may be further configured to store the determined one or more controls in a look-up table in which the determined one or more controls are indexed to correspond to the measured one or more parameters.

Example 11 may include the apparatus of example 10 and/or any other example disclosed herein, for which the look-up table may be trained based on the junction temperature of the DUT corresponding to the predetermined test temperature.

Example 12 may include the apparatus of example 11 and/or any other example disclosed herein, for which the processor may be further configured to, based on the look-up table being trained, control the ATE to measure at least one parameter of a next test instance for testing another DUT, during execution of the next test instance on the other DUT, and determine, using the measured at least one parameter as an index in the trained look-up table, at least one control for controlling the temperature of the thermal head connected to the other DUT so that a junction temperature of the other DUT corresponds to the predetermined test temperature.

Example 13 provides a method including controlling an automatic test equipment (ATE) to measure one or more parameters of a current test instance for testing a device under test (DUT), during execution of the current test instance on the DUT, and determining, based on the measured one or more parameters, one or more controls for controlling a temperature of a thermal head connected to the DUT so that a junction temperature of the DUT corresponds to a predetermined test temperature. The method further includes controlling the temperature of the thermal head, based on the determined one or more controls.

Example 14 may include the method of example 13 and/or any other example disclosed herein, further including generating a list of test instances for testing the DUT, each of the test instances causing a power draw of the DUT or a power density of the DUT to change at a rate greater than a predetermined rate.

Example 15 may include the method of example 14 and/or any other example disclosed herein, further including generating a predetermined range of temperatures in which the junction temperature of the DUT can deviate from the predetermined test temperature during execution of each of the test instances on the DUT.

Example 16 may include the method of example 14 and/or any other example disclosed herein, for which the controlling the ATE may include controlling the ATE to measure one or more parameters of only each of the test instances included in the generated list, during execution of a respective one of the test instances on the DUT.

Example 17 may include the method of example 13 and/or any other example disclosed herein, for which the controlling the temperature of the thermal head may include, based on the one or more controls including pre-emphasis controls, before execution of a next test instance for testing the DUT, controlling the temperature of the thermal head to correspond to a predetermined pre-emphasis temperature.

Example 18 may include the method of example 13 and/or any other example disclosed herein, for which the controlling the temperature of the thermal head may include, based on the one or more controls including gain controls, while the current test instance is executed, controlling the temperature of the thermal head to increase or decrease by a predetermined gain temperature.

Example 19 provides a non-transitory computer-readable medium including instructions, which, if executed by a processor, cause the processor to control an automatic test equipment (ATE) to measure one or more parameters of a current test instance for testing a device under test (DUT), during execution of the current test instance on the DUT, and determine, based on the measured one or more parameters, one or more controls for controlling a temperature of a thermal head connected to the DUT so that a junction temperature of the DUT corresponds to a predetermined test temperature. The instructions, which, if executed by the processor, further cause the processor to control the temperature of the thermal head, based on the determined one or more controls.

Example 20 may include the non-transitory computer-readable medium of example 19 and/or any other example disclosed herein, for which the instructions, which, if executed by the processor, may further cause the processor to, based on the one or more controls including pre-emphasis controls, before execution of a next test instance for testing the DUT, control the temperature of the thermal head to correspond to a predetermined pre-emphasis temperature.

Example 21 provides an apparatus including first controlling means for controlling an automatic test equipment (ATE) to measure one or more parameters of a current test instance for testing a device under test (DUT), during execution of the current test instance on the DUT, and determining means for determining, based on the measured one or more parameters, one or more controls for controlling a temperature of a thermal head connected to the DUT so that a junction temperature of the DUT corresponds to a predetermined test temperature. The apparatus further includes second controlling means for controlling the temperature of the thermal head, based on the determined one or more controls.

Example 22 may include the apparatus of example 19 and/or any other example disclosed herein, for which the second controlling means may be further for, based on the one or more controls including pre-emphasis controls, before execution of a next test instance for testing the DUT, controlling the temperature of the thermal head to correspond to a predetermined pre-emphasis temperature.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The methods described herein may be performed and the various processing or computation units and the devices and computing entities described herein may be implemented by one or more circuits. In an embodiment, a "circuit" may be understood as any kind of a logic implementing entity, which may be hardware, software, firmware, or any combination thereof. Thus, in an embodiment, a "circuit" may be a hard-wired logic circuit or a programmable logic circuit such as a programmable processor, e.g., a microprocessor. A "circuit" may also be software being implemented or executed by a processor, e.g., any kind of computer program, e.g., a computer program using a virtual machine code. Any other kind of implementation of the respective functions that are described herein may also be understood as a "circuit" in accordance with an alternative embodiment.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An apparatus comprising:
a processor configured to:
control an automatic test equipment (ATE) to measure one or more parameters of a current test instance for testing a device under test (DUT), during execution of the current test instance on the DUT;
determine, based on the measured one or more parameters, one or more controls for controlling a temperature of a thermal head connected to the DUT so that a junction temperature of the DUT corresponds to a predetermined test temperature; and
based on the one or more controls comprising pre-emphasis controls, before execution of a next test instance for testing the DUT, control the temperature of the thermal head to correspond to a predetermined pre-emphasis temperature.

2. The apparatus of claim 1, wherein the one or more parameters comprises any one or any combination of a power draw of the DUT, the junction temperature of the DUT and leakage and/or ring oscillator frequencies of the DUT.

3. The apparatus of claim 1, wherein the processor is further configured to generate a list of test instances for testing the DUT, each of the test instances causing a power draw of the DUT or a power density of the DUT to change at a rate greater than a predetermined rate.

4. The apparatus of claim 3, wherein the processor is further configured to generate a predetermined range of temperatures in which the junction temperature of the DUT can deviate from the predetermined test temperature during execution of each of the test instances on the DUT.

5. The apparatus of claim 4, wherein the junction temperature of the DUT corresponds to the predetermined test temperature based on a difference between the junction temperature and the predetermined test temperature being within the predetermined range of temperatures.

6. The apparatus of claim 3, wherein the processor is further configured to control the ATE to measure one or more parameters of only each of the test instances comprised in the generated list, during execution of a respective one of the test instances on the DUT.

7. The apparatus of claim 1, wherein the temperature of the thermal head corresponds to the predetermined pre-emphasis temperature based on a difference between the temperature of the thermal head and the predetermined pre-emphasis temperature being within a predetermined range of temperatures.

8. The apparatus of claim 1, wherein the processor is further configured to, based on the one or more controls comprising gain controls, while the current test instance is executed, control the temperature of the thermal head to increase or decrease by a predetermined gain temperature.

9. The apparatus of claim 1, wherein the processor is further configured to store the determined one or more controls in a look-up table in which the determined one or more controls are indexed to correspond to the measured one or more parameters.

10. The apparatus of claim 9, wherein the look-up table is trained based on the junction temperature of the DUT corresponding to the predetermined test temperature.

11. The apparatus of claim 10, wherein the processor is further configured to, based on the look-up table being trained:
control the ATE to measure at least one parameter of a next test instance for testing another DUT, during execution of the next test instance on the other DUT; and
determine, using the measured at least one parameter as an index in the trained look-up table, at least one control for controlling the temperature of the thermal head connected to the other DUT so that a junction temperature of the other DUT corresponds to the predetermined test temperature.

12. A method comprising:
controlling an automatic test equipment (ATE) to measure one or more parameters of a current test instance for testing a device under test (DUT), during execution of the current test instance on the DUT;
determining, based on the measured one or more parameters, one or more controls for controlling a temperature of a thermal head connected to the DUT so that a junction temperature of the DUT corresponds to a predetermined test temperature; and
controlling the temperature of the thermal head, based on the one or more controls comprising pre-emphasis controls, before execution of a next test instance for testing the DUT, to correspond to a predetermined pre-emphasis temperature.

13. The method of claim 12, further comprising generating a list of test instances for testing the DUT, each of the test instances causing a power draw of the DUT or a power density of the DUT to change at a rate greater than a predetermined rate.

14. The method of claim 13, further comprising generating a predetermined range of temperatures in which the junction temperature of the DUT can deviate from the predetermined test temperature during execution of each of the test instances on the DUT.

15. The method of claim 13, wherein the controlling the ATE comprises controlling the ATE to measure one or more parameters of only each of the test instances comprised in the generated list, during execution of a respective one of the test instances on the DUT.

16. The method of claim 12, wherein the controlling the temperature of the thermal head comprises, based on the one or more controls comprising gain controls, while the current test instance is executed, controlling the temperature of the thermal head to increase or decrease by a predetermined gain temperature.

17. A non-transitory computer-readable medium comprising instructions, which, if executed by a processor, cause the processor to:

control an automatic test equipment (ATE) to measure one or more parameters of a current test instance for testing a device under test (DUT), during execution of the current test instance on the DUT;

determine, based on the measured one or more parameters, one or more controls for controlling a temperature of a thermal head connected to the DUT so that a junction temperature of the DUT corresponds to a predetermined test temperature; and control the temperature of the thermal head, based on the one or more controls comprising pre-emphasis controls, before execution of a next test instance for testing the DUT, to correspond to a predetermined pre-emphasis temperature.

18. The non-transitory computer-readable medium of claim 17, wherein the instructions, which, if executed by the processor, further cause the processor to generate a list of test instances for testing the DUT, each of the test instances causing a power draw of the DUT or a power density of the DUT to change at a rate greater than a predetermined rate.

19. The non-transitory computer-readable medium of claim 17, wherein the instructions, which, if executed by the processor, further cause the processor to, based on the one or more controls comprising gain controls, while the current test instance is executed, control the temperature of the thermal head to increase or decrease by a predetermined gain temperature.

20. The non-transitory computer-readable medium of claim 17, wherein the instructions, which, if executed by the processor, further cause the processor to store the determined one or more controls in a look-up table in which the determined one or more controls are indexed to correspond to the measured one or more parameters.

* * * * *